(12) United States Patent
Harada

(10) Patent No.: US 7,034,876 B2
(45) Date of Patent: Apr. 25, 2006

(54) SOLID-STATE IMAGE PICKUP DEVICE AND METHOD FOR DRIVING THE SAME

(75) Inventor: Kouichi Harada, Kanagawa (JP)

(73) Assignee: Sony Corporation, Tokyo (JP)

( * ) Notice: Subject to any disclaimer, the term of this patent is extended or adjusted under 35 U.S.C. 154(b) by 718 days.

(21) Appl. No.: 10/015,160

(22) Filed: Dec. 11, 2001

(65) Prior Publication Data

US 2002/0105586 A1    Aug. 8, 2002

(30) Foreign Application Priority Data

Dec. 12, 2000    (JP)    ............................ P2000-377573

(51) Int. Cl.
*H04N 3/14*    (2006.01)
*H04N 5/335*    (2006.01)

(52) U.S. Cl. ...................... 348/319; 348/316; 348/312; 348/320

(58) Field of Classification Search ................ 348/321, 348/294, 302, 311
See application file for complete search history.

(56) References Cited

U.S. PATENT DOCUMENTS 4,012,587 A * 3/1977 Ochi et al. .................. 348/315
4,559,550 A * 12/1985 Koike et al. ................. 257/233
4,603,343 A * 7/1986 Matsumoto et al. ......... 348/319
4,837,630 A * 6/1989 Ueda ........................... 348/319
4,989,095 A * 1/1991 Whitesel et al. ............. 348/314
6,356,305 B1 * 3/2002 Akagawa ..................... 348/311
6,384,436 B1 * 5/2002 Kudoh et al. ................ 257/231
2002/0118291 A1 * 8/2002 Ishigami et al. ............. 348/311

* cited by examiner

*Primary Examiner*—Ngoc-Yen Vu
*Assistant Examiner*—James M. Hannett
(74) *Attorney, Agent, or Firm*—Sonnenschein, Nath & Rosenthal LLP

(57) ABSTRACT

In a solid-state image pickup device, third transfer electrodes are disposed in parallel to vertical transfer registers, and second transfer electrodes are disposed vertically to the vertical transfer registers. These transfer electrodes are also formed on the read-out gate portions to supply a driving voltage for reading out signal charges from photoelectric conversion elements. On the basis of the driving voltage applied to both the third and second transfer electrodes, the read-out of the signal charges to the vertical transfer registers is carried out. At the portion where the read-out of the signal charges is carried out, the transfer electrode at the read-out gate portion side and the sensor area of the photoelectric conversion element are formed so as to be adjacent to each other. At the portion where no read-out of signal charges is carried out, an offset area is provided between the transfer electrode at the read-out gate portion side and the sensor area of the photoelectric conversion element.

4 Claims, 9 Drawing Sheets

SOLID-STATE IMAGE PICKUP DEVICE AND METHOD FOR DRIVING THE SAME

RELATED APPLICATION DATA

The present application claims priority to Japanese Application(s) No(s). P2000-377573 filed Dec. 12, 2000, which application(s) is/are incorporated herein by reference to the extent permitted by law.

BACKGROUND OF THE INVENTION

1. Field of the Invention

The present invention relates to a solid-state image pickup device having photoelectric conversion elements (sensors) which are arranged two-dimensionally, such as a CCD solid-state image pickup device, and a method of driving the solid-state image pickup device.

2. Description of the Related Art

In order to enhance the dynamic range in an image sensor using a CCD solid-state image pickup device (hereinafter referred to as "CCD image sensor"), there have been proposed various methods of picking up images with photoelectric conversion elements which are different in sensitivity and then composing these pickup images into an image.

According to a first method of these methods, incident light is optically split to plural optical axes which are different in transmittance, and then the light beams thus split are detected by plural CCD image sensors arranged on the respective optical axes (see Japanese Laid-open Patent Application Nos. Hei-8-223491, Hei-7-254965, Hei-7-254966, Hei-8-340486 and Hei-10-69011, and U.S. Pat. No. 5,801,773).

According to a second method, an exposure time is divided into plural sub exposure times, plural images are respectively picked up at a different time and for a different sub exposure time by using one CCD image sensor, and then the plural images thus achieved are composed with one another (see Japanese Laid-open Patent Application Nos. Hei-8-331461 and Hei-7254965, U.S. Pat. Nos. 5,420,635 and 5,455,621, Japanese Laid-open Patent Application No. Hei-6-141229, U.S. Pat. No. 5,801,773, U.S. Pat. No. 5,638,118 and U.S. Pat. No. 5,309,243).

According to a third method, an image is picked up by using one CCD image sensor while the photoelectric conversion elements of the CCD image sensor are made different in sensitivity, and then signals detected by the plural photoelectric conversion elements different in sensitivity are composed with one another (see U.S. Pat. No. 5,789,737, Japanese Laid-open Patent Application No. Sho-59-217358, U.S. Pat. No. 5,420,635). In these prior art publications, it has been proposed that filters different in transmittance are covered on the respective photoelectric conversion elements as a method of varying the sensitivity of the photoelectric conversion elements in the CCD image sensor.

The first method needs plural CCD image sensors and a complicated optical system for splitting light, and thus has a problem that the manufacturing cost and the scale of the apparatus are increased.

According to the second method, information (image) detected with different sensitivity is achieved at a different time and for a different sub exposure time, so that it is difficult to accurately pick up the images of a moving subject and the resolution to a moving subject (hereinafter referred to as "dynamic resolution") cannot be enhanced.

Further, the third method can solve the problems of the first and second methods, that is, both the problem that the apparatus is complicated and the problem that the dynamic resolution cannot be enhanced. However, in the third method, the filters different in transmittance must be covered on the photoelectric conversion elements to perform sensitivity control, and thus the sensitivity of each photoelectric conversion element is fixed in the manufacturing process of the CCD image sensor, so that the sensitivity cannot be variably controlled. Therefore, it is difficult to variably control the enlarging rate of the dynamic range in accordance with the condition.

In order to avoid the problem that it is difficult to variably control the enlargement rate of the dynamic range in accordance with the condition because the sensitivity of each photoelectric conversion element is fixed, Japanese Laid-open Patent Application No. Hei-9-191099 discloses a technique in which signals of a selected column are read out after a first accumulation time, then an electrical shutter is actuated, and then signals of columns other than the above selected column are read out after a subsequent second accumulation time, thereby enlarging the dynamic range.

However, as in the case of the method of covering the photoelectric conversion elements with the filters, the third method has a problem that the degree of freedom for the design of a spatial pattern of sensitivity is low, and for example it has a problem that signals having plural kinds of exposure times such as three or more kinds cannot be achieved in the vertical direction.

Further, since the first accumulation time and the second accumulation time are timely separated from each other by the charge sweep-out operation of the electronic shutter, the image pickup timing is different between a column from which charges are read out for the first accumulation time and a column from which charges are read out for the second accumulation time. Therefore, the dynamic resolution cannot be enhanced like the second method.

Still further, in order to promote the multi-pixel design or the compact design for the CCD solid-state image pickup device used for the CCD image sensor described above, the unit cell of each pixel is required to be designed in a more minute structure (that is, the microstructure of the unit cell is required to be further enhanced).

SUMMARY OF THE INVENTION

In order to solve the above problems, an object of the present invention is to provide a solid-state image pickup device that brings flexibility to the spatial pattern design of the sensitivity of each photoelectric conversion element, has a broad dynamic range and a high dynamic resolution and is suitable in structure for further microstructure, and a method of driving the solid-state image pickup device.

According to a first aspect of the present invention, there is provided a solid-state image pickup device that comprises: plural photoelectric conversion elements arranged two-dimensionally, gate portions for reading out signal charges that are photoelectrically-converted in the plural photoelectric conversion elements; plural vertical transfer registers for transferring the signal charges read out through the gate portions in the vertical direction; and first transfer electrodes and second transfer electrodes to which driving voltages are applied to transfer the signal charges of the vertical transfer registers, characterized in that the first transfer electrodes are disposed in parallel to the vertical transfer registers, the second transfer electrodes are disposed vertically to the vertical transfer registers, the first transfer electrodes and the second transfer electrodes are formed so as to extend to the upper sides of the gate portions and supplied with the driving voltages to read out the signal charges from the photoelectric conversion elements, so that the signal charges which are photoelectrically-converted in the photoelectric conversion elements are read out to the vertical transfer registers by the driving voltages applied to both the first transfer electrodes and the second transfer electrodes, the first transfer electrode or the second transfer electrode at the gate portion side of each photoelectric conversion element and the sensor area of the photoelectric conversion element are formed to be adjacent to each other at a portion where the read-out of a signal charge from the photoelectric conversion element to the corresponding vertical transfer register is carried out, and an offset area is formed between the transfer electrode at the gate portion side of each photoelectric conversion element and the sensor area of the photoelectric conversion element at a portion where the read-out of a signal charge from the photoelectric conversion element to the corresponding vertical transfer register is not carried out.

According to a second aspect of the present invention, there is provided a method of driving a solid-state image pickup device comprising: plural photoelectric conversion elements arranged two-dimensionally; gate portions for reading out signal charges photoelectrically-converted in the plural photoelectric conversion elements, and plural vertical transfer registers for transferring the signal charges read out by the gate portions in the vertical direction, the vertical transfer registers having first transfer electrodes and second transfer electrodes thereon, characterized in that a first driving voltage to transfer the signal charges in the vertical direction are applied to the first transfer electrodes and the second transfer electrodes, and a second driving voltage to read out the signal charges from the photoelectric conversion elements are also applied to the first transfer electrodes and the second transfer electrodes, whereby the read-out operation of the signal charges photoelectrically-converted in the photoelectric conversion elements to the vertical transfer registers is carried out on the plural photoelectric conversion elements independently every column or/and every line by the driving voltages applied to both the first transfer electrodes and the second transfer electrodes.

According to the solid-state image pickup device of the present invention, the signal charges which are photoelectrically converted in the photoelectric conversion elements are read out to the vertical transfer registers by the driving voltages applied to the first transfer electrodes and the second transfer electrodes, whereby a so-called AND type solid-state image pickup device is constructed.

Further, the first transfer electrode or the second transfer electrode at the gate portion side of each photoelectric conversion element and the sensor area of the photoelectric conversion element are formed so as to be adjacent to each other at the portion where the read-out of the signal charge to the corresponding vertical transfer register is carried out, so that the signal charge can be read out between the neighboring sensor area and transfer electrode.

Still further, at the portion where the read-out of the signal charge to the vertical -transfer register is not carried out, the offset area is formed between the transfer electrode at the gate portion side of each photoelectric conversion element and the sensor area of the photoelectric conversion element, so that no read-out of the signal charge is carried out at this portion. Therefore, it is discriminated on the basis of the presence or absence of the offset area whether the read-out of the signal charges is carried out or not.

According to the driving method for the solid-state image pickup device of the present invention, the read-out operation is carried out by the driving voltages applied to both the first transfer electrodes and the second transfer electrodes, and thus the so-called AND type operation is carried out.

Further, the read-out operation of the signal charges photoelectrically-converted in the photoelectric conversion elements to the vertical transfer registers is carried out on the plural photoelectric conversion elements independently every column or/and every line, whereby the accumulation time of the signal charges of the photoelectric conversion elements is independently varied every column or/and every line to achieve signals for which the accumulation time is varied.

DETAILED DESCRIPTION OF THE INVENTION

Figure 1:
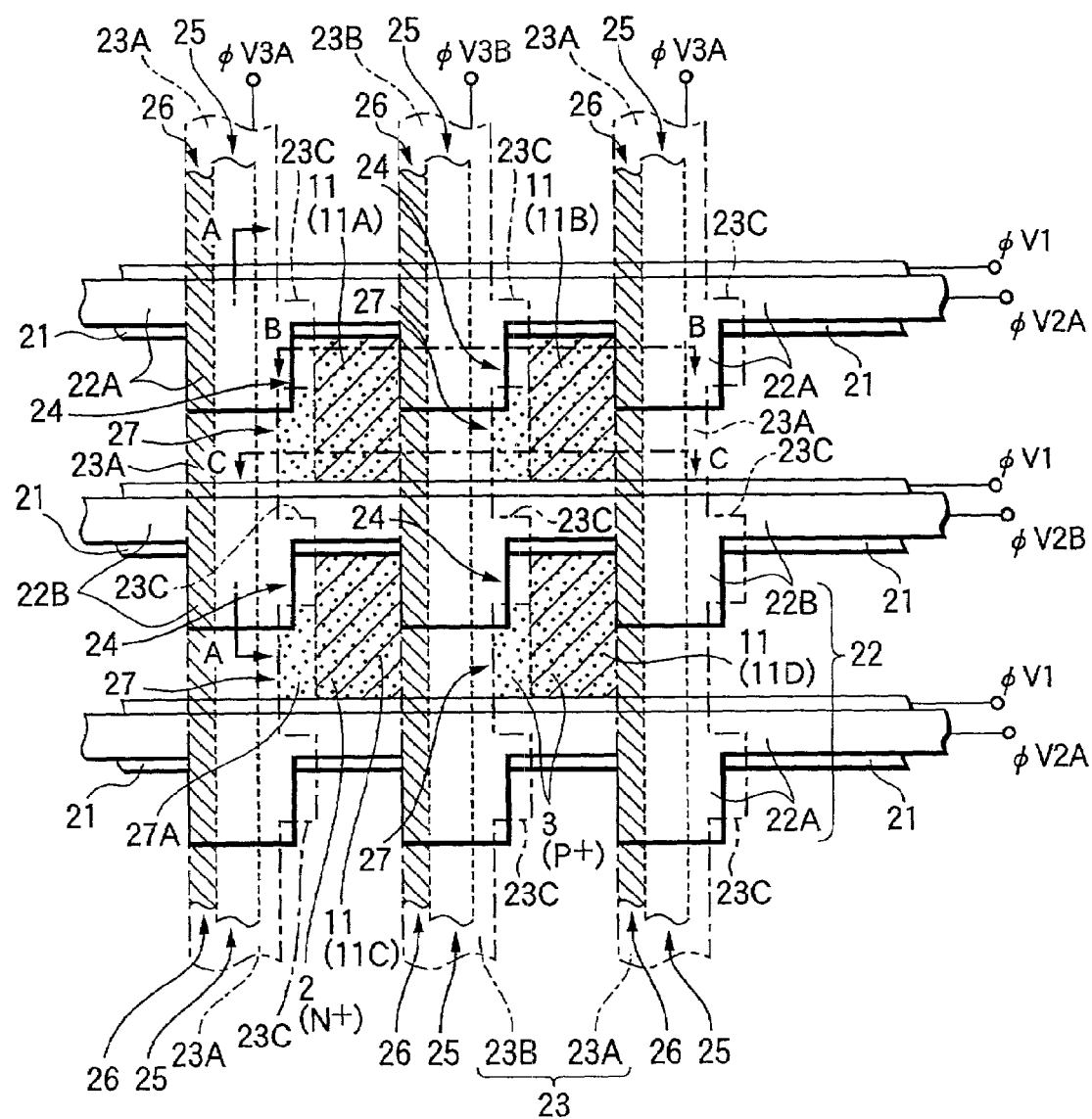
FIG. 1 is a diagram showing the construction (a plan view of the main part) of a CCD solid-state image pickup device according to an embodiment of the present invention.

According to the present invention, there is provided a solid-state image pickup device that comprises a plurality of two-dimensionally-arranged photoelectric conversion elements, gate portions for reading out signal charges that are photoelectrically-converted by the plural photoelectric conversion elements, plural vertical transfer registers for transferring in the vertical direction the signal charges read out by the gate portions; a horizontal transfer register for horizontally transferring the signal charges transferred from the plural vertical transfer registers; and at least first transfer electrodes and second transfer electrodes to which driving voltages to transfer the signal charges in the vertical direction through the vertical transfer registers are applied, wherein the first transfer electrodes are disposed in parallel to the vertical transfer registers, the second transfer electrodes are disposed vertically to the vertical transfer registers, the first transfer electrodes and the second transfer electrodes are formed so as to extend to the upper side of the gate portions and supplied with the driving voltages to read out the signal charges from the photoelectric conversion elements, so that the signal charges photoelectrically-converted in the photoelectric conversion elements are read out to the vertical transfer registers by the driving voltages applied to both the first transfer electrodes and the second transfer electrodes, the first transfer electrode or the second transfer electrode at the gate portion side of each photoelectric conversion element and the sensor area of the photoelectric conversion element are formed to be adjacent to each other at a portion where the read-out of the signal charge to the corresponding vertical transfer register is carried out, and an offset area is formed between the transfer electrode at the gate portion side of each photoelectric conversion element and the sensor area of the photoelectric conversion element at a portion where the read-out of the signal charge to the corresponding vertical transfer register is not carried out.

In the solid-state image pickup device of the present invention, an offset area is also provided between the first transfer electrode and the second transfer electrode of the vertical transfer registers at the opposite side to the gate portion with respect to each photoelectric conversion element and the sensor area of the photoelectric conversion element.

In the solid-state image pickup device of the present invention, at the portions where the read-out of the signal charges to the vertical transfer registers is carried out, the transfer electrodes at the gate portion side of each photoelectric conversion element are formed so as to extend to the sensor area side of the photoelectric conversion element.

In the solid-state image pickup device of the presents invention, at the portions where the read-out of the signal charges to the vertical transfer registers is carried out, the sensor area of each photoelectric conversion element is formed so as to extend to the gate portion side.

According to the present invention, there is provided a method of driving a sold-state image pickup device comprising a plurality of two-dimensionally arranged photoelectric conversion elements, gate portions for reading out signal charges photoelectrically-converted in the plural photoelectric conversion elements, plural vertical transfer registers for transferring the signal charges read out by the gate portions in the vertical direction, and a horizontal transfer register for transferring the signal charges transferred from the plural vertical transfer registers in the horizontal direction, and at least first and second transfer electrodes on the vertical transfer registers, wherein a driving voltage for transferring the signal charges in the vertical direction is applied to the first and second transfer electrodes, and a driving voltage for reading out the signal charges from the photoelectric conversion elements is applied to the first and second transfer electrodes, whereby the read-out operation of the signal charges which are photoelectrically-converted by the photoelectric conversion elements to the vertical transfer registers is carried out on the plural photoelectric conversion elements independently every column or/and every line by the driving voltages applied to both the first and second transfer electrodes.

Prior to the detailed description of preferred embodiments, the summary of the present invention will be described.

The present invention is applied to a solid-state image pickup device comprising plural photoelectric conversion elements (sensors) which are two-dimensionally arranged, gate portions for reading out the signal charges that are photoelectrically-converted by the plural photoelectric conversion elements (sensors), plural vertical transfer registers for transferring the signals read out by the gate portions in the vertical direction, and a horizontal transfer register for transferring in the horizontal direction the signal charges transferred from the plural vertical transfer registers.

Here, the construction of the solid-state image pickup device described above is shown in FIG. 9 (a plan view of the main part of the solid-state image pickup device).

Figure 9:
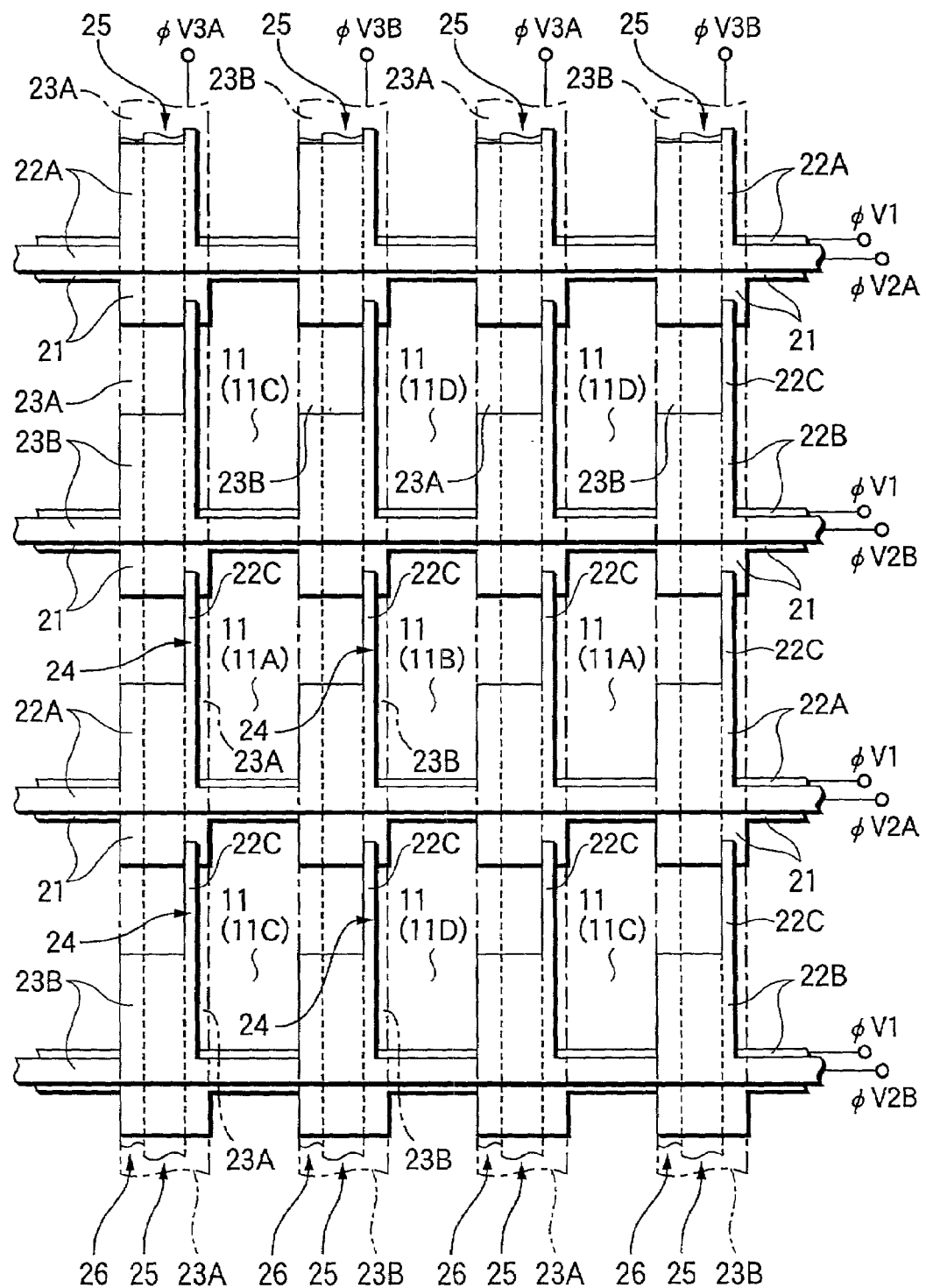
FIG. 9 is a diagram (a plan view showing the main part) showing an AND type CCD solid-state image pickup device.

The CCD solid-state image pickup device shown in FIG. 9 has plural two-dimensionally-arranged photoelectric conversion elements, that is, sensors 11. A transfer electrode 21 formed of a first layer of polycrystalline silicon and a transfer electrode 22 (22A, 22B) formed of a second layer of polycrystalline silicon are disposed at one side of each column of the sensors 11, and a vertical transfer register 25 is disposed at the one side of each column of the sensors 11 in conformity with the transfer electrodes 21, 22.

Further, a transfer electrode 23 (23A, 23B) of a third layer is disposed on the transfer electrodes 21, 22 of the first layer and the second layer in parallel to the vertical transfer register 25.

A gate portion 24 for reading out a signal charge photoelectrically-converted by each sensor 11 is disposed between the sensor 11 and the vertical transfer register 25 located at the left side of the sensor 11, and a channel stop area 26 for separating the respective sensor columns from one another is disposed between each sensor 11 and the vertical transfer register 25 at the right side of the sensor 11.

The signal charge photoelectrically-converted by each sensor 11 is read out through the read-out gate portion 24 to the vertical transfer register 25 at the left side of the sensor 11. The signal charge thus read out is transferred in the vertical direction by the vertical transfer register 25.

A horizontal transfer register (not shown) for transferring the signal charge transferred from each vertical transfer register 25 in the horizontal direction is disposed at the end portion of each vertical transfer register 25.

Each transfer electrode 21 of the first polycrystalline silicon layer comprises a lead portion which is formed between the sensors 11 arranged in the vertical direction so as to extend in the horizontal direction, and an electrode portion which downwardly projects along the vertical transfer register 25 in FIG. 9. Each of the transfer electrodes 22A, 22B of the second polycrystalline silicon layer comprises a lead portion which is formed between the sensors 11 arranged in the vertical direction so as to extend in the horizontal direction, and an electrode portion which upwardly projects along the vertical transfer register 25 in FIG. 9. The transfer electrode 22A, 22B formed of the second polycrystalline silicon layer has an extension portion 22C at the upper side thereof in the vertical direction at the read-out gate portion 24, and the extension portion 22C extends to the upper side of the first-layer transfer electrode 21 located just above the transfer electrode concerned.

A first vertical transfer clock $\phi V1$ is applied to the transfer electrodes 21 of the first polycrystalline silicon layer, and second vertical transfer clocks $\phi V2A$, $\phi V2B$ are applied to the transfer electrodes 22A, 22B of the second polycrystalline silicon layer, respectively. Further, third vertical transfer clocks $\phi V3A$, $\phi V3B$ are applied to the transfer electrodes 23A, 23B of the third polycrystalline silicon layer, respectively. The vertical transfer operation of the signal charges is carried out in a three-phase driving mode based on these vertical transfer clocks by the transfer electrodes 21, 22 (22A, 22B), 23 (23A, 23B).

The second vertical transfer clocks $\phi V2A$, $\phi V2B$ and the third vertical transfer clocks $\phi V3A$, $\phi V3B$ are used to apply not only a driving voltage for vertically transferring the signal charges in the vertical transfer registers 25, but also a high-level driving voltage for reading out the signal charges photoelectrically-converted in the sensors 11 to the vertical transfer registers 25.

When, in the read-out gate portion 24, the high-level driving voltage to read-out the signal charges is applied to both of each transfer electrode 22A or 22B of the second polycrystalline silicon layer and each of the transfer electrode 23A or 23B of the third polycrystalline silicon layer by the second vertical transfer clock φV2A or φV2B and the third vertical transfer clock φV3A or φV3B respectively, the signal charges photoelectrically-converted by the sensors 11 are read out to the vertical transfer registers 25. That is, a so-called AND type CCD solid-state image pickup device is constructed.

If the timing at which the high-level driving voltage is applied is varied between the vertical transfer clock φV2A applied to the transfer electrodes 22A and the vertical transfer clock φV2B applied to the transfer electrodes 22B, the signal charges of the plural sensors 11 could be controlled to be read out independently every line.

Likewise, if the timing at which the high-level driving voltage is applied is varied between the vertical transfer clock φV3A applied to the transfer electrodes 23A and the vertical transfer clock φV3B applied to the transfer electrodes 23B, the signal charges of the plural sensors 11 could be controlled to be read out independently every column.

Further, the signal charges of the plural sensors 11 can be controlled to be read out independently every line and every column by combining the second vertical transfer clock φV2A, φV2B and the third vertical transfer clock φV3A, φV3B. Further, by varying the read-out timing of a first sensor group 11A, a second sensor group 11B a third sensor group 11C and a fourth sensor group 11D, the accumulation time can be made different among the respective sensor groups.

That is, the signal charges accumulated in the photoelectric conversion elements can be read out independently every pixel.

In the case of the construction shown in FIG. 9, the extension portion 22C at the electrode portion of the transfer electrode 22A, 22B of the second layer located at the read-out gate portion 24 is formed to have a relatively small width. The extension portion 22C is required to have a width to be determined in consideration of the positioning between the extension portion 22C and the transfer electrode 23 (23A, 23B) of the third layer, etc. Therefore, it is difficult to make each unit cell more minute (i.e. to design each unit cell in a further microstructure), and thus it is difficult to more enhance a multi-pixel structure or a compact structure for future CCD solid-state image pickup devices.

Therefore, according to the present invention, there is provided a solid-state image pickup device that can perform the same AND type operation as the CCD solid-state image pickup device shown in FIG. 9 and also easily more enhance the microstructure of the unit cell.

Figure 2A:
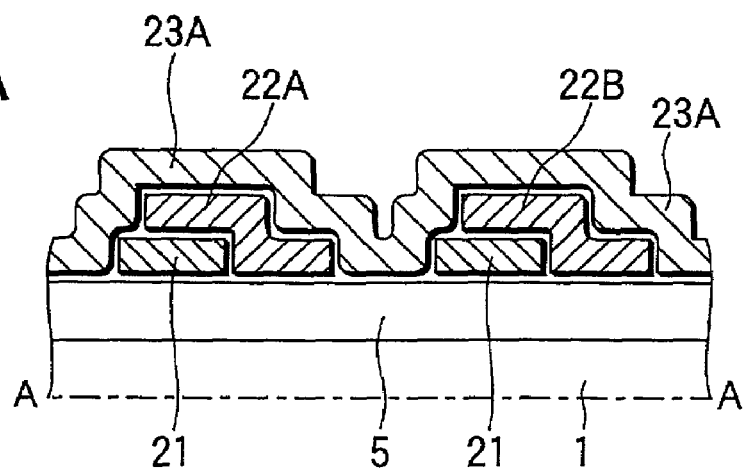
FIGS. 2A to 2C are cross-sectional views taken along A—A, B—B and C—C of FIG. 1, respectively.
Figure 2B:
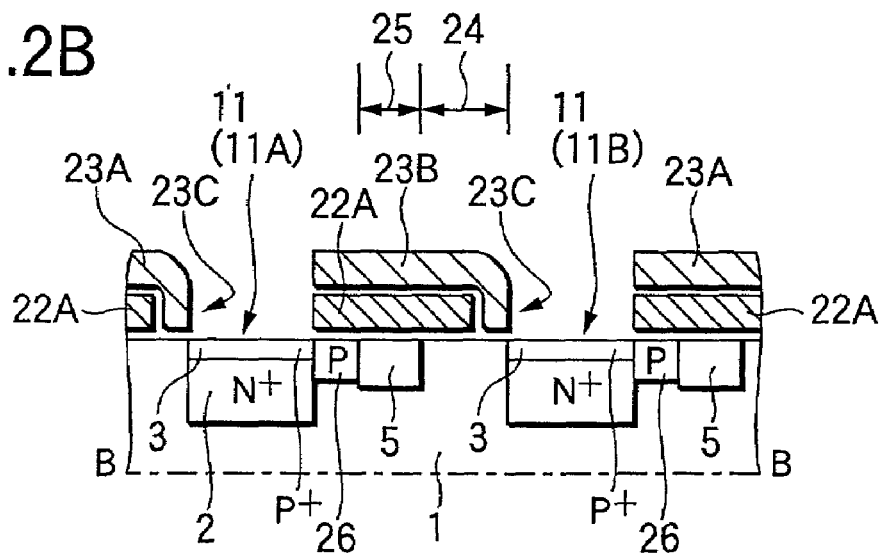
Figure 2C:
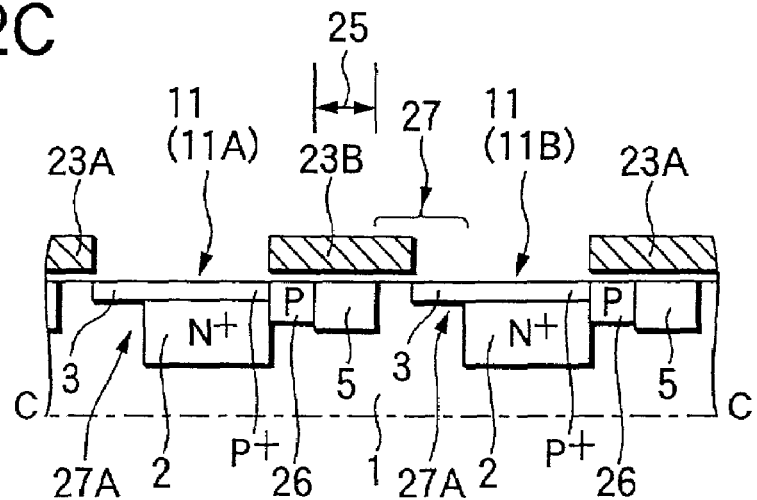

FIG. 1 shows the construction of a CCD solid-state image pickup device according to an embodiment of the present invention (plan view of the main part). FIG. 2A is a cross-sectional view of an arrow of A—A of FIG. 1, FIG. 2B is a cross-sectional view of an arrow of B—B of FIG. 1, and FIG. 2C is a cross-sectional view of an arrow of C—C of FIG. 1.

The CCD solid-state image pickup device of this embodiment has a plurality of two-dimensionally arranged photoelectric conversion elements (that is, sensors 11), and vertical transfer registers 25 each of which is provided at one side of each sensor column.

Transfer electrodes 21 of first polycrystalline silicon layers and transfer electrodes 22 (22A, 22B) of second polycrystalline silicon layers are disposed on the vertical transfer registers 25. In conformity with the transfer electrodes 21, 22, transfer electrodes 23 (23A, 23B) of third layers are disposed in parallel to the vertical transfer registers 25 on the transfer electrodes 21, 22 of the first and second layers while each transfer electrode 23 is located at one side of each sensor column.

A read-out gate portion 24 for reading out a signal charge photoelectrically-converted by each sensor 11 is disposed between the sensor 11 and the vertical transfer register 25 located at the left side of the sensor 11, and a channel stop area 26 for separating the respective sensor columns from each other is disposed between each sensor 11 and the vertical transfer register 25 located at the right side of the sensor 11 as being hatched in FIG. 1.

The signal charge which is photoelectrically-converted by each sensor 11 is read out through the read-out gate portion 24 to the vertical transfer register 25 located at the left side of the sensor 11. The signal charge thus read out is transferred in the vertical direction in the vertical transfer register 25.

A horizontal transfer register (not shown) for transferring the signal charge transferred from each vertical transfer register 25 in the horizontal direction is provided at the end portion of each vertical transfer register 25.

A first vertical transfer clock φV1 is applied to each transfer electrode 21 of the first polycrystalline silicon layer. Second vertical transfer clocks φV2A, φV2B are applied to the transfer electrodes 22A, 22B of the second polycrystalline silicon layers, respectively. Third vertical transfer clocks φV3A, φV3B are applied to the transfer electrodes 23A, 23B of the third polycrystalline silicon layers, respectively. By these vertical transfer clocks, the vertical transfer of the signal charges is carried out in the three-phase driving mode based on these vertical transfer clocks by the transfer electrodes 21, 22 (22A, 22B), 23 (23A, 23B) of the respective layers.

The second vertical transfer clocks φV2A, φV2B and the third vertical transfer clocks φV3A, φV3B are used not only to apply the driving voltage for vertically transferring the signal charges in the vertical transfer registers 25, but also to apply the high-level driving voltage for reading out the signal charges photoelectrically-converted by the sensors 11 to the vertical transfer registers 25.

When, in the read-out gate portion 24, the high-level driving voltage for reading out the signal charges is applied to the transfer electrodes 22A or 22B of the second polycrystalline silicone layers and the transfer electrodes 23A or 23B of the third polycrystalline silicon layers by the second vertical transfer clock φV2A or φV2B and the third vertical transfer clock φV3A or φV3B respectively, the signal charges which are photoelectrically-converted by the sensors 11 are read out to the vertical transfer registers 25.

That is, like the CCD solid-state image pickup device shown in FIG. 9, the so-called AND type CCD solid-state image pickup device is constructed.

As shown in the cross-sectional view of FIGS. 2A to 2C, an N+ impurity region 2, a P+ positive charge accumulating region 3 and a transfer channel 5 are formed in the neighborhood of the surface of a semiconductor substrate 1.

A photodiode of each sensor 11 is constructed by the N+ impurity region 2 and the P+ positive charge accumulating region 3, and each vertical transfer register 25 is constructed by the transfer channel 5 and the transfer electrodes 21, 22 and 23 just above the transfer channel 5.

The semiconductor substrate 1 comprises a semiconductor substrate alone, or a combination of a semiconductor substrate and a semiconductor epitaxial layer on the semiconductor substrate.

The channel stop area 26 is constructed by a P type impurity region formed in the semiconductor substrate 1.

As shown in the cross-sectional view of FIG. 2A, the first-layer transfer electrodes 21, the second-layer transfer electrodes 22 (22A, 22B) and the third-layer transfer electrodes 23 (23A) are repetitively and alternately disposed so as to be adjacent to the transfer channel 5.

In this embodiment, the construction of the sensor 11, and the transfer electrode 22A, 22B of the second polycrystalline silicon layer and the transfer electrode 23A, 23B of the third polycrystalline silicon layer located at the left side of the sensor 11 at which the read-out gate portion 24 is located is different from that of the CCD solid-state image pickup device of FIG. 9.

That is, each transfer electrode 21 of the first polycrystalline silicon layer is formed between the sensors 11 located in the vertical direction so as to extend in the horizontal direction.

Each of the transfer electrodes 22A, 22B of the second polycrystalline silicon layer comprises a lead portion extending in the horizontal direction between the sensors 11 located in the vertical direction, and an electrode portion projecting downwardly in the figure along the vertical transfer register 25. A read-out gate portion 24 is formed at the electrode portion of the transfer electrode 22A, 22B of the second polycrystalline silicon layer.

Each transfer electrode 23A, 23B of the third polycrystalline silicon layer is formed so as to extend to the sensor 11 at the read-out gate portion 24, and an extension portion 23C thus extending is adjacent to the sensor 11. That is, as shown in the cross-sectional view of FIG. 2B, the extension portion 23C is formed so as to cover the transfer electrode 22A of the second layer and face the sensor 11, whereby when the high-level driving voltage is applied to both the transfer electrodes 22A, 22B of the second layers and the extension portions 23C of the transfer electrodes 23A, 23B of the third layers, the signal charges are read out from the sensors 11 to the vertical transfer registers 25 at the read-out gate portions 24.

At the portion other than the read-out gate portion 24 at the left side of each sensor 11, that is, at the portion 27 where the read-out of the signal charge is not carried out, the N+ impurity region 2 (hatched in FIG. 1) of each sensor 11 and the transfer electrode 23A, 23B of the third polycrystalline silicon layer are formed so as to a gap therebetween, thereby forming an offset area 27A. The P+ positive charge accumulating region 3 (dotted in FIG. 1) of each sensor 11 is formed adjacently to the transfer electrode 23A, 23B of the third layer. That is, as shown in the cross-sectional view of FIG. 2C, the N+ impurity region 2 of the sensor 11 is formed so as to be backwardly displaced from the transfer electrode 23A, 23B of the third layer, and the offset area 27A is formed at the displaced portion between the N+ impurity region 2 and the transfer electrode 23A, 23B.

The existence of the offset area 27A between the N+ impurity region 2 of the sensor 11 (sensor area) and the transfer electrode 23A, 23B of the third layer prevents the read-out of the signal charges from the sensor 11 at this portion 27.

If the timing at which the high-level driving voltage is applied is varied between the vertical transfer clock $\phi V2A$ applied to the transfer electrodes 22A and the vertical transfer clock $\phi V2B$ applied to the transfer electrodes 22B, the signal charges of the plural sensors 11 could be controlled to be read out independently every line.

Likewise, if the timing at which the high-level driving voltage is applied is varied between the vertical transfer clock $\phi V3A$ applied to the transfer electrodes 23A and the vertical transfer clock $\phi V3B$ applied to the transfer electrodes 23B, the signal charges of the plural sensors 11 could be controlled to be read out independently every column.

Further, the signal charges of the plural sensors 11 can be controlled to be read out independently every line and every column by suitably combining the second vertical transfer clocks $\phi V2A$, $\phi V2B$ and the third vertical transfer clocks $\phi V3A$, $\phi V3B$.

That is, the signal charges accumulated in the photoelectric conversion elements can be read out independently every pixel.

In the case of FIG. 1, the exposure time can be set independently for each pixel every repetitive unit of 2 pixels×2 pixels. Accordingly, by varying the read-out timing of a first sensor group 11A, a second sensor group 11B, a third sensor group 11C and a fourth sensor group 11D, the accumulation time can be varied among the respective sensor groups.

Accordingly, signals can be achieved by each of the sensor groups 11A, 11B, 11C, 11D while the exposure time is varied, and an image can be picked up by using these signals on the basis of a so-called SVE (Spatially Varying exposure), that is, an exposure system of varying the exposure time of each sensor (photoelectric conversion element) with some patterns every sensor. According to this system, signals for which the dynamic range is enhanced can be achieved.

An embodiment of the operation of the SVE system in the CCD solid-state image pickup device shown in FIG. 1 will be described with reference to FIG. 3.

Figure 3:
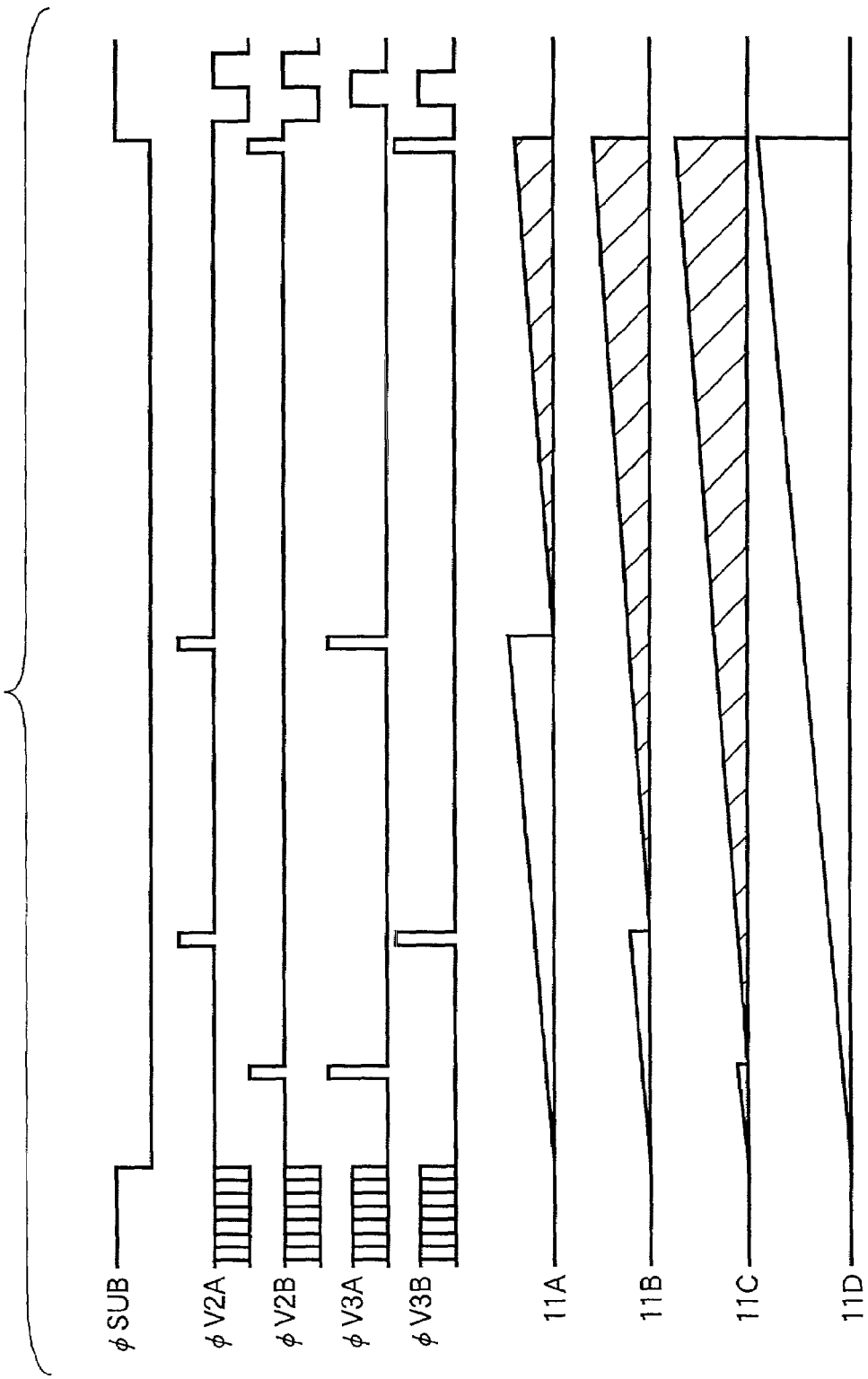
FIG. 3 is a diagram showing an operation based on an SVE system in the CCD solid-state image pickup device of FIG. 1.

In FIG. 3, $\phi$SUB shows the driving waveform of a substrate voltage, and 11A, 11B, 11C, 11D show the accumulation states of charges of each sensor of the sensor groups 11A, 11B, 11C, 11D. The charges at hatched portions in all the charges accumulated are not read out and discarded to the substrate.

First, the substrate voltage $\phi$SUB is set to a low level and the accumulation of charges is started in each of the sensor groups 11A, 11B, 11C, 11D.

Subsequently, the high-level read-out voltage is supplied by the vertical transfer clocks $\phi V2B$ and $\phi V3A$, and the signal charges of the third sensor group 11C connected to the transfer electrodes 22B and the transfer electrodes 23A are first read out.

Subsequently, the high-level read-out voltage is supplied by the vertical transfer clocks $\phi V2A$ and $\phi V3B$, and the signal charges of the second sensor group 11B connected to the transfer electrodes 22A and the transfer electrodes 23B are read out.

Thereafter, the high-level read-out voltage is supplied by the vertical transfer clocks $\phi V2A$ and $\phi V3A$, and the signal charges of the first sensor group 11A connected to the transfer electrodes 22A and 23A are read out.

Finally, the high-level read-out voltage is supplied by the vertical transfer clocks $\phi V2B$ and $\phi V3B$, and the signal charges of the fourth sensor group 11D connected to the transfer electrodes 22B and the transfer electrodes 23B are read out. Just after this operation, the substrate voltage $\phi$SUB is set to a high level, and the charges of the sensors 11 are discharged to the substrate side, whereby the charges accumulated in the sensors 11A, 11B, 11C other than the sensors of the fourth sensor group 11D are not read out, but discarded.

As described above, signals are read out from the sensors 11 of the four sensor groups while the exposure time is varied under the following condition: 11C<11B<11A<11D.

Further, the signal accumulation time period is overlapped among the four sensor groups 11, and thus the time displacement can be reduced to a value less than the second method described above, and the dynamic resolution can be more enhanced.

FIG. 3 shows an example of the timing of the vertical transfer clocks, and the timing at which the high-level driving voltage for the read-out in the second and third vertical transfer clocks is applied is not limited to that of FIG. 3, and it may be set to any timing as occasion demands.

According to the above-described embodiment, there is provided an AND type construction in which the high-level driving voltage for read-out is applied to the transfer electrodes 22 (22A, 22B) of the second polycrystalline silicon layers and the transfer electrodes 23 (23A, 23B) of the third polycrystalline silicon layers to read the signal charges from the sensors 11.

By making the timing different between the second vertical transfer clocks $\phi$V2A, $\phi$V2B applied to the transfer electrodes 22A, 22B of the second layers or making the timing different between the third vertical transfer clocks $\phi$V3A, $\phi$V3B applied to the transfer electrodes 23A, 23B of the third layers, the signal read-out timing of the sensors 11 may be varied every other column or every other line.

Accordingly, the exposure time can be set independently for each pixel every repetitive unit of 2 pixels×2 pixels (four pixels), whereby signals can be achieved while the accumulation time is changed by varying the read-out timing of the first sensor group 11A, the second sensor group 11B, the third sensor group 11C and the fourth sensor group 11D, so that the signals for which the dynamic range is enhanced can be achieved. Further, the time displacement of the accumulation time can be reduced, so that the dynamic resolution can be enhanced.

Further, the read-out operation is not carried out in the offset area 27A.

Accordingly, the read-out of the signal charges from the sensors 11 to the vertical transfer registers 25 is carried out at the read-out gate portions 24, and the signal charges are read out to the transfer channels 5 below the electrode portions of the transfer electrodes 22 of the second layers.

On the basis of the presence or absence of the extension portion 23C of the electrode portion of the transfer electrode 23 of the third layer and the presence or absence of the offset area 27A between the transfer electrode 22, 23 and the sensor area 2 of the sensor 11, the read-out gate portion 24 and the non-read-out portion 27 can be discriminated from each other.

Therefore, it is unnecessary to design the transfer electrodes 23 at the read-out gate portion 24 in a special shape like the construction shown in FIG. 9.

Accordingly, the transfer electrode constituting the read-out gate portion 24, that is, the electrode portion of the transfer electrode 22 of the second layer and the extension portion 23C of the electrode portion of the transfer electrode 23 of the third layer can be formed to have a relatively large width, and thus it can be designed to have a pattern for which the microstructuring can be more easily enhanced. Further, even when it is microstructured, the margin for the positioning can be kept. Accordingly, even when the unit cell is further microstructured, the further multi-pixel design and the further compact design can be implemented for the CCD solid-state image pickup device.

In this embodiment, the extension portion 23C extending to the sensor 11 side is formed at the electrode portion of the transfer electrode 23 of the third layer, however, any other construction can be used insofar as it enables signal charges to be read out at the read-out gate portions 24.

Figure 4:
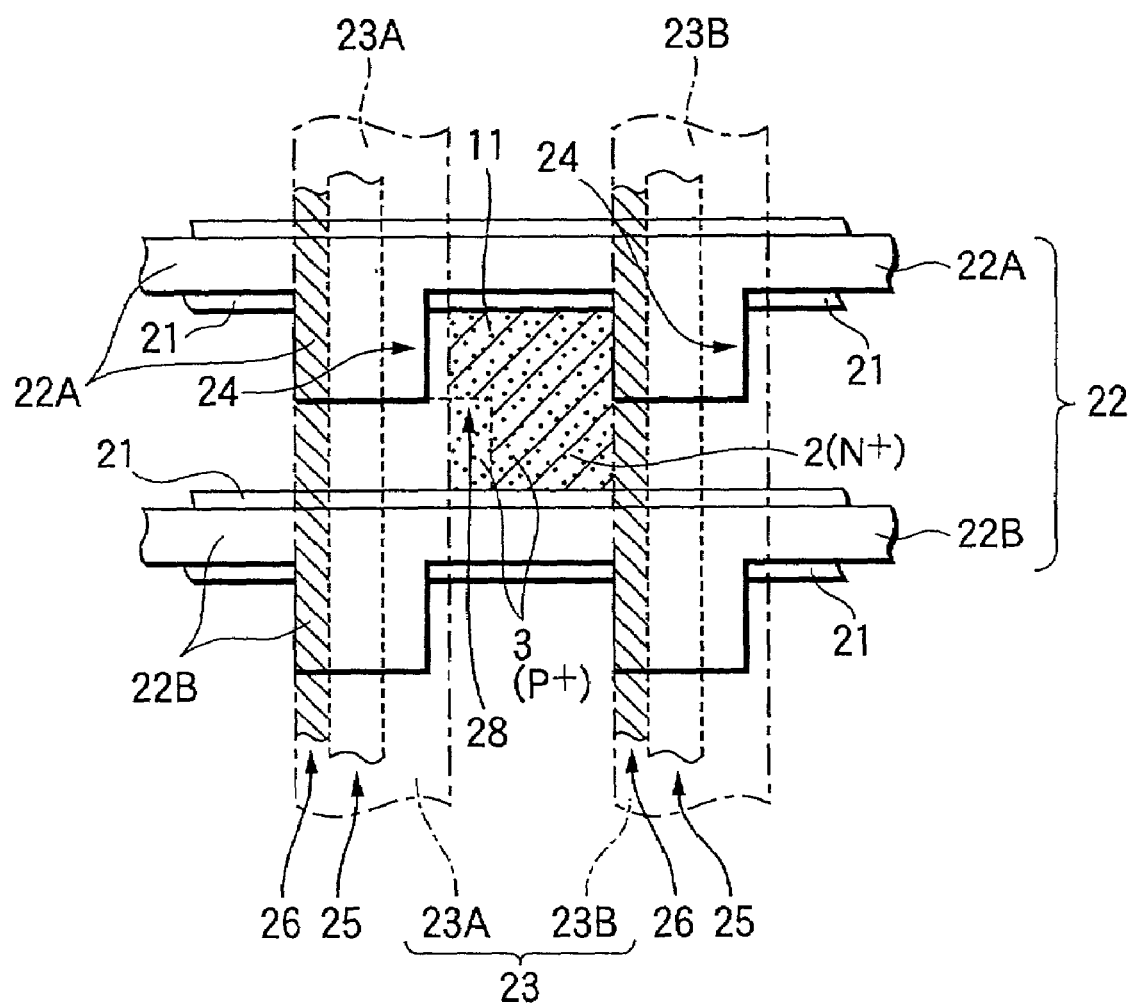
FIG. 4 is a diagram (a plan view of the main part) showing the construction in which the sensor area of the sensor is extended to the transfer electrode side in the construction of FIG. 1.

For example, as shown in the plan view of FIG. 4, the transfer electrodes 23 of the third layer may be formed just in the vertical direction while the sensor areas 2 of the sensors 11 are formed so as to extend to the transfer electrodes 23 of the third layer, thereby constructing the read-out gate portions 24.

In the case of FIG. 4, at the portions other than the read-out gate portions 24, the N+ impurity region 2 of each sensor 11 does not extend to the transfer electrode 23, and thus an offset area 28 is set therebetween. The signal charges are not read out from the sensor 11 at this portion by the offset area 28.

Accordingly, as in the case of the construction shown in FIGS. 1 and 2, the high-level driving voltage for readout is applied to the transfer electrodes 22A, 22B of the second layer and the transfer electrodes 23A, 23B of the third layer to carry out the read-out operation.

Figure 5:
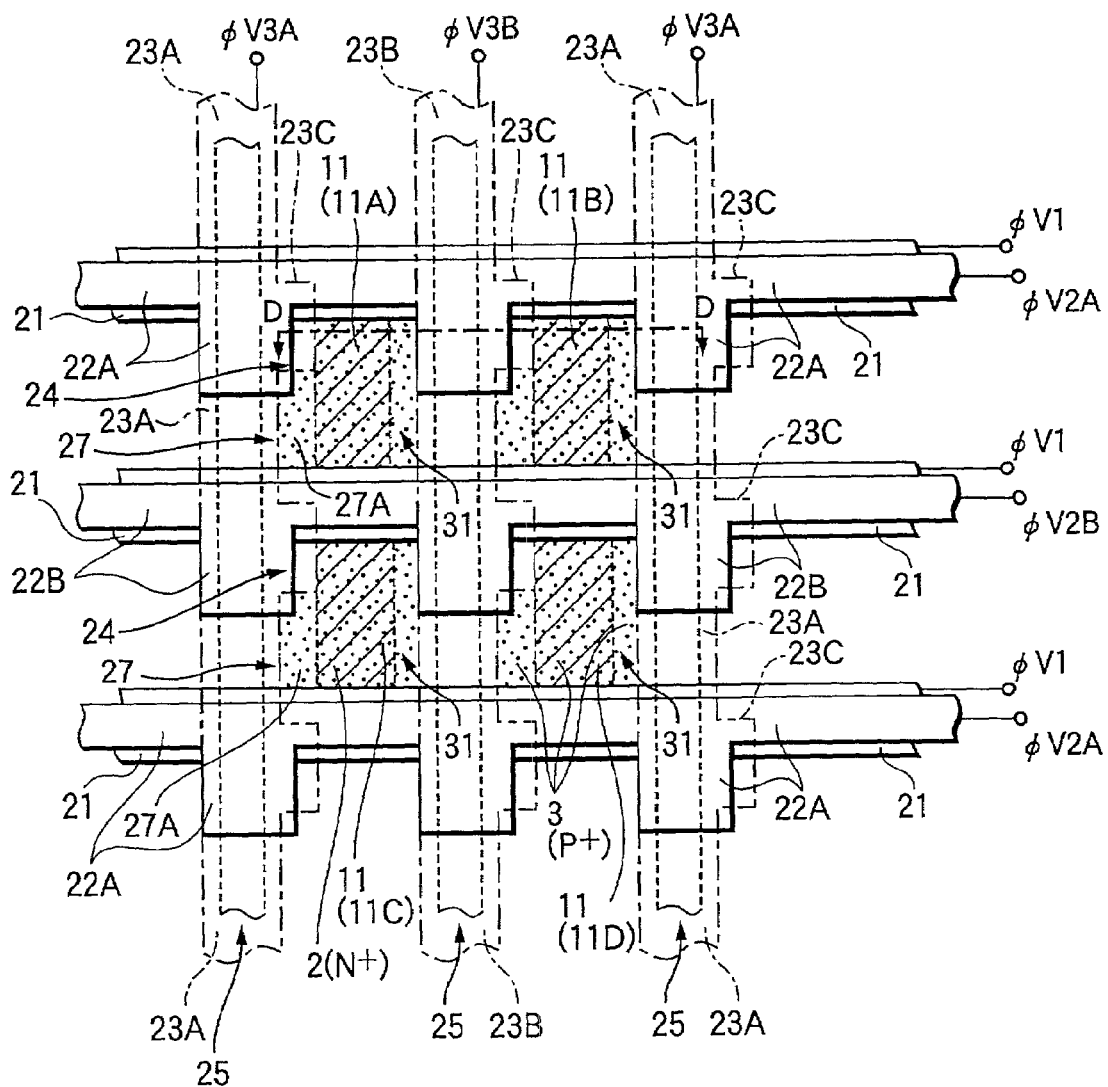
FIG. 5 is a diagram (a plan view of the main part) showing the CCD solid-state image pickup device according to another embodiment of the present invention.
Figure 6:
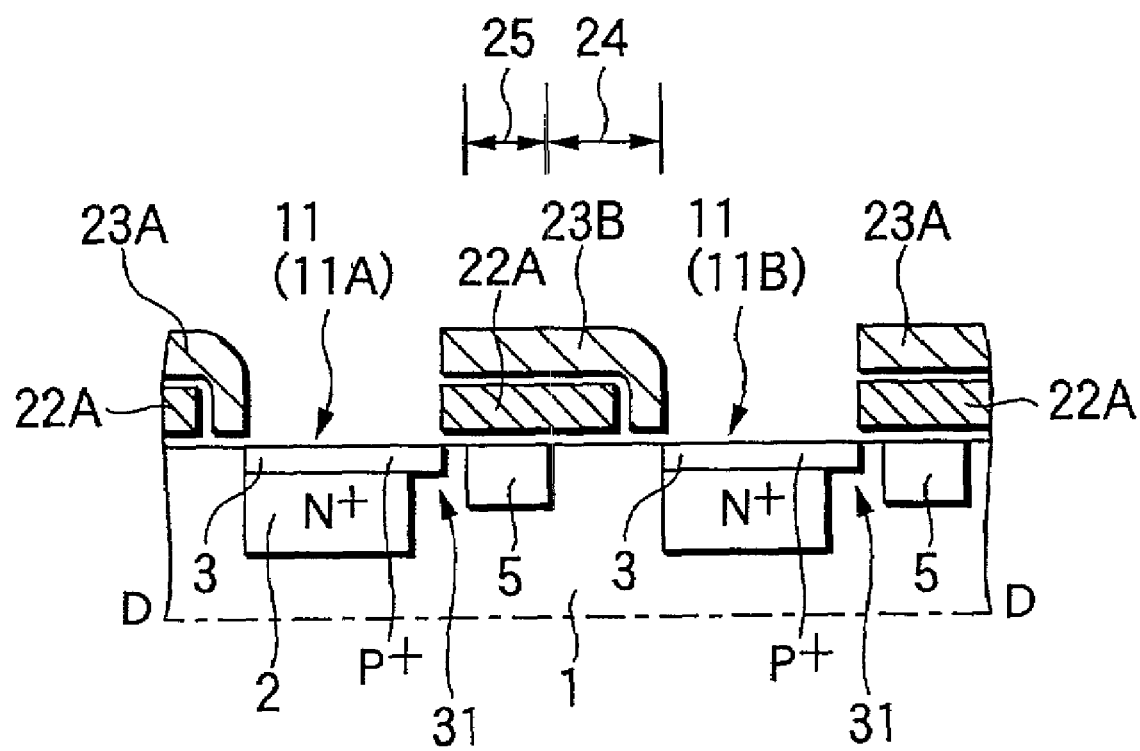
FIG. 6 is a cross-sectional view taken along D—D of FIG. 6.

FIG. 5 schematically shows the construction of a CCD solid-state image pickup device of another embodiment of the present invention (plan view of the main part), and FIG. 6 is a cross-sectional view of an arrow of D—D of FIG. 5.

In the CCD solid-state image pickup device of this embodiment, an offset area 31 is provided between each column of the sensors 11 and the vertical transfer register 25 at the right side of the sensor column, that is, at the opposite side to the read-out gate portion 24 with respect to each sensor.

As shown in the cross-sectional view of FIG. 6, the N+ impurity region 2 of each sensor 11 is formed so as to be backwardly displaced with respect to the transfer electrodes 22A, 23A (23B) in the offset area 31. The other construction is the same as the above-described embodiment. The same elements as the above-described embodiment are represented by the same reference numerals, and the duplicative description is omitted.

According to this embodiment, the offset area 31 is provided between each sensor 11 and the vertical transfer register 25 at the right side thereof, so that the neighboring columns can be separated from each other as in the case of the channel stop areas 26 of the above embodiment.

Further, the step of forming the P type channel stop areas 26 in the substrate 1 is not needed, and thus the number of manufacturing steps can be reduced.

Figure 7:
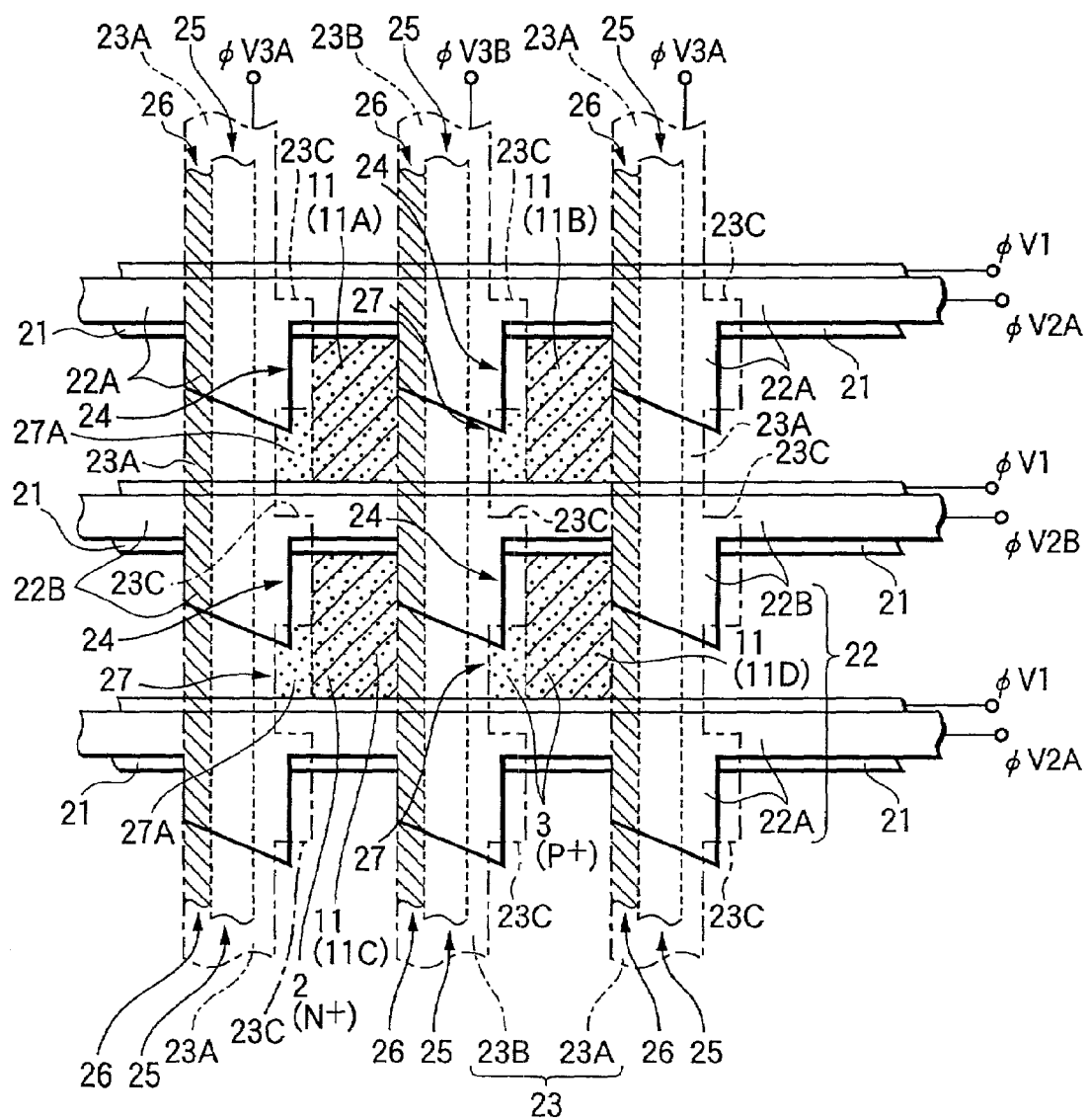
FIG. 7 is a diagram (a plan view of the main part) showing the CCD solid-state image pickup device according to another embodiment of the present invention.

FIG. 7 schematically shows the construction of a CCD solid-state image pickup device according to another embodiment (a plan view of the main part).

The CCD solid-state image pickup device of this embodiment is achieved by modifying the shape of the electrode portions of the transfer electrodes 22 (22A, 22B) of the second layers of the CCD solid-state image pickup device shown in FIG. 1.

The electrode portion of each transfer electrode 22 (22A, 22B) of the second layer is formed so as to be wide at the read-out gate portion 24 side, narrow at the opposite side to the read-out gate portion 24 and obliquely linear therebetween.

According to this embodiment, the electrode portion of each transfer electrode 22 of the second layer is formed so as to be large in width at the read-out gate portion 24 side, so that even when the read-out voltage is reduced, the read-out of the signal charges of the sensors 11 can be surely carried out.

By reducing the read-out voltage, the consumption voltage of the CCD solid-state image pickup device can be reduced, and the electrode portions and the circuit for supplying the transfer clocks can be simplified in construction.

Further, the electrode portion of each transfer electrode 22 of the second layer is formed so as to be small in width at the opposite side to the read-out gate portion 24, so that the ratio of the area of the electrode portion of each transfer electrode 22 of the second layer and the area of the portion at which the transfer electrode 23 of the third layer is not overlapped with the transfer electrode 22 of the second layer and faces the transfer channel 5 in the vertical transfer register 25 can be set to substantially the same as the construction shown in FIG. 1.

Accordingly, by equalizing the charge amounts to be accumulated below the transfer electrodes 21, 22, 23 of the respective layers in the vertical transfer registers 25, the charge amount to be handled by each vertical transfer register 25 can be prevented from being reduced, and the charge amount to be handled by each vertical transfer register 25 can be set to substantially the same as the construction shown in FIG. 1. Therefore, the other characteristics than the read-out voltage can be set to substantially the same as the construction shown in FIG. 1.

Figure 8:
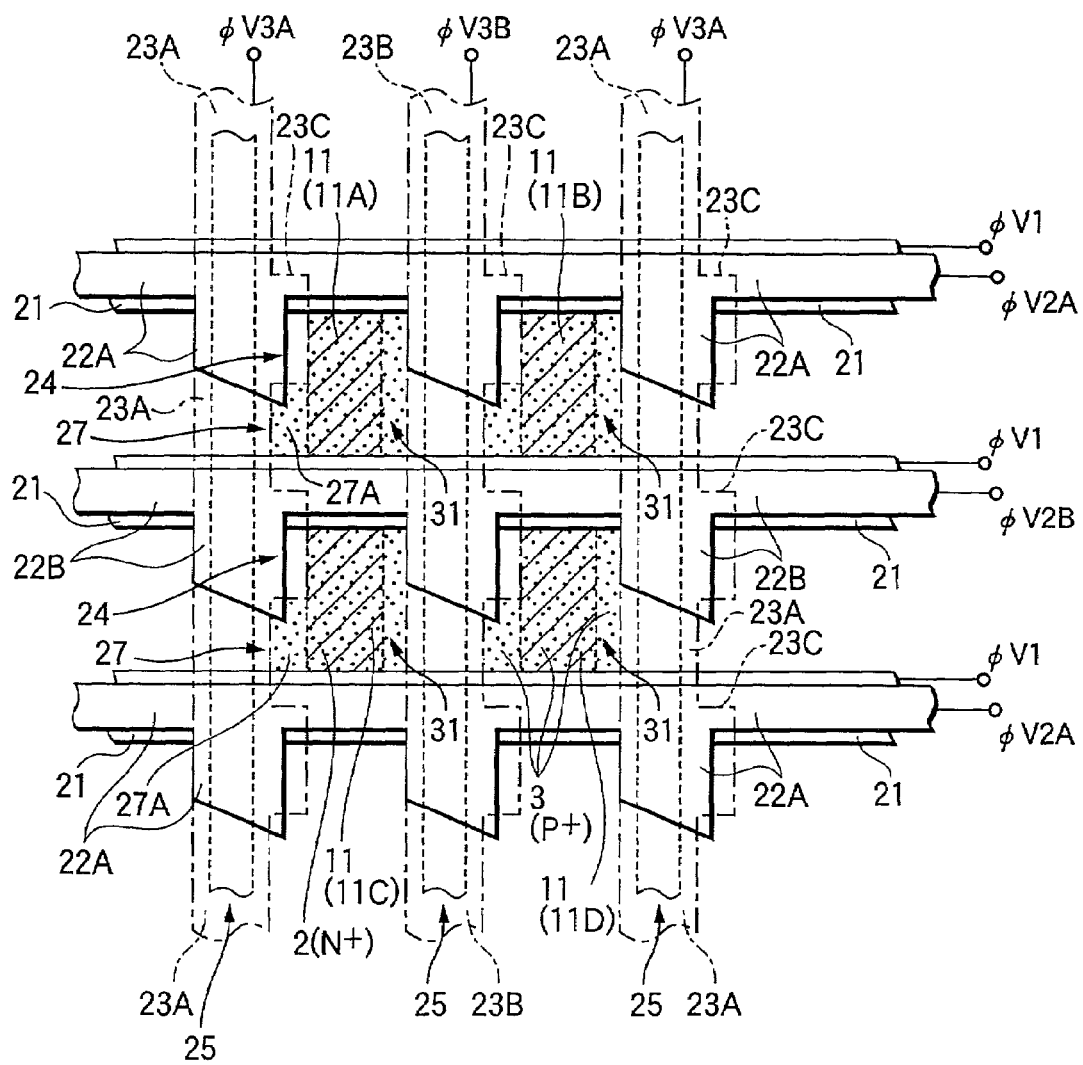
FIG. 8 is a diagram (a plan view of the main part) showing the CCD solid-state image pickup device according to another embodiment of the present invention.

Further, FIG. 8 is a schematic diagram (plan view of the main part) of a CCD solid-state image pickup device of another embodiment of the present invention, which is achieved by modifying the shape of the electrode portions of the transfer electrodes 22 (22A, 22B) of the second layer in the construction of the CCD solid-state image pickup device shown in FIG. 5 as in the case of the embodiment of FIG. 7.

In the case of the construction shown in FIG. 8, both of an advantage that the step of forming the channel stop areas shown in FIG. 5 can be omitted and an advantage that the read-out voltage shown in FIG. 7 can be reduced can be achieved.

In the embodiments shown in FIGS. 7 and 8, the end edge of the electrode portion of each transfer electrode 22 (22A, 22B) of the second layer is obliquely linearly formed, however, it may be formed in any other shape such as a stepwise shape, or a curved line insofar as the required charge amount to be handled by the vertical transfer register 25 can be secured.

In each of the above-described embodiments, the transfer electrodes 21 of the first layer are horizontally in a stripe shape. However, in the case of the construction shown in FIG. 9, the transfer electrode 21 of the first layer may be formed so as to extend along the vertical transfer register 25 so that the width of the electrode portion thereof is larger than that of the lead portion.

Actually, the dimension and interval of the respective transfer electrodes are set so that the charge amounts to be handled by the transfer electrodes of the respective layers of the vertical transfer register 25, that is, the charge amounts to be handled by the transfer electrodes 21, 22, 23 of the first, second and third Layers are equal to one another.

Further, in the above-described embodiments, there are prepared two kinds of vertical transfer clocks for each of the two-phase vertical transfer clock ($\phi$V2A, $\phi$V2B) and the three-phase vertical transfer clock ($\phi$V3A, $\phi$V3B), however, three or more kinds of vertical transfer clocks may be prepared to make minute the variation of the read-out timing.

Still further, in the above-described embodiments, the present invention is applied to the CCD solid-state image pickup device. However, the present invention may be applied any other solid-state image pickup device insofar as it can transfer signal charges accumulated in each photoelectric conversion element (sensor) and then convert the signal charges to a voltage at the output portion.

The present invention is not limited to the above embodiments, and various modifications may be made without departing from the subject matter of the present invention.

According to the present invention, on the basis of the presence or absence of the offset area between the transfer electrode at the gate portion side and the photoelectric conversion element, the gate portion at which the read-out is carried out and the portion where no read-out is carried out can be discriminated from each other, so that it is unnecessary to design the transfer electrodes of the gate portions in a special shape. Accordingly, the transfer electrodes can be designed in a pattern which is suitable to enhance the microstructure, and the cell size can be made more minute. Therefore, according to the present invention, the multi-pixel and compact design of the solid-state image pickup device can be enhanced.

Further, according to the present invention, in the solid-state image pickup device in which the so-called AND type operation is carried out, signals for which the accumulation time is varied can be achieved by varying the accumulation time of the signal charges of plural photoelectric conversion elements independently every column or/and every line. The accumulation time can be varied and set to any value.

Accordingly, signals for which the dynamic range is enhanced can be achieved. Further, the time displacement of the accumulation time can be reduced and thus the dynamic resolution can be enhanced.

When the offset area is also provided between the first transfer electrode/the second transfer electrode of the vertical transfer register at the opposite side to the gate portion with respect to the photoelectric conversion element and the sensor area of the photoelectric conversion element, the step of forming the channel stop area is not needed, so that the number of manufacturing steps can be reduced.

What is claimed is:

1. A solid-state image pickup device, characterized by comprising:
    a plurality of two-dimensionally-arranged photoelectric conversion elements;
    gate portions for reading out signal charges that are photoelectrically-converted by said plural photoelectric conversion elements;
    plural vertical transfer registers for transferring in the vertical direction the signal charges read out by said gate portions; and
    first transfer electrodes and second transfer electrodes to which driving voltages to transfer the signal charges of said vertical transfer registers are applied, wherein said first transfer electrodes are disposed in parallel to said vertical transfer registers, said second transfer electrodes are disposed vertically to said vertical transfer registers, said first transfer electrodes and said second transfer electrodes are provided so as to contain the upper side of said gate portions, and the signal charges which are photoelectrically-converted in said photoelectric conversion elements are read out to said vertical transfer registers by the driving voltages applied to both said first transfer electrodes and said second transfer electrodes, the first transfer electrode or the second transfer electrode at the gate portion side of each photoelectric conversion element and the sensor area of the photoelectric conversion element are formed to be adjacent to each other at a portion where the read-out of the signal charges to each vertical transfer register is carried out, and an offset area, is formed between the transfer electrode at the gate portion side of each photoelectric conversion element and the sensor area of the photoelectric conversion element at a portion where the read-out of the signal charges to each vertical transfer register is not carried out.

2. The solid-state image pickup device as claimed in claim 1, wherein a second offset area is provided between said first transfer electrode and said second transfer electrode at the opposite side to said gate portion with respect to each photoelectric conversion element and said sensor area of said photoelectric conversion element.

3. The solid-state image pickup device as claimed in claim 1, wherein at the portions where the read-out of the signal charges to said vertical transfer registers is carried out, said transfer electrodes at the gate portion side of each photoelectric conversion element are formed so as to extend to the sensor area side of the photoelectric conversion element.

4. The solid-state image pickup device as claimed in claim 1, wherein at the portions where the read-out of the signal charges to said vertical transfer registers is carried out, the sensor area of each photoelectric conversion element is formed so as to extend to the gate portion side.

* * * * *